United States Patent
Lin et al.

(10) Patent No.: US 9,779,957 B2
(45) Date of Patent: Oct. 3, 2017

(54) METHOD OF MANUFACTURING INDEPENDENT DEPTH-CONTROLLED SHALLOW TRENCH ISOLATION

(71) Applicant: NANYA TECHNOLOGY CORP., Tao-Yuan, Hsien (TW)

(72) Inventors: Shian-Jyh Lin, New Taipei (TW); Jeng-Ping Lin, Taoyuan County (TW); Chin-Piao Chang, New Taipei (TW); Jen-Jui Huang, Taoyuan County (TW)

(73) Assignee: NANYA TECHNOLOGY CORP., New Taipei (TW)

( * ) Notice: Subject to any disclaimer, the term of this patent is extended or adjusted under 35 U.S.C. 154(b) by 0 days.

(21) Appl. No.: 14/447,634

(22) Filed: Jul. 31, 2014

(65) Prior Publication Data

US 2014/0342567 A1 Nov. 20, 2014

Related U.S. Application Data

(63) Continuation of application No. 13/615,526, filed on Sep. 13, 2012, now abandoned.

(51) Int. Cl.
*H01L 21/76* (2006.01)
*H01L 21/308* (2006.01)
*H01L 21/762* (2006.01)

(52) U.S. Cl.
CPC .... *H01L 21/3081* (2013.01); *H01L 21/76224* (2013.01)

(58) Field of Classification Search
CPC ...................... H01L 21/76229; H01L 21/3081
See application file for complete search history.

(56) References Cited

U.S. PATENT DOCUMENTS

| 5,798,544 A | 8/1998 | Ohya |
| 2008/0057733 A1* | 3/2008 | Chung ................ H01L 21/0332 438/760 |
| 2012/0049294 A1* | 3/2012 | Chen ............... H01L 21/823431 257/401 |

FOREIGN PATENT DOCUMENTS

| CN | 102386230 A | 3/2012 |
| CN | 102412179 A | 4/2012 |
| KR | 20030092569 A | 12/2003 |

* cited by examiner

*Primary Examiner* — Hsin-Yi Hsieh
(74) *Attorney, Agent, or Firm* — Winston Hsu

(57) ABSTRACT

A method of manufacturing a semiconductor structure. A patterned first hard mask is formed on a substrate. The patterned first hard mask includes first trench patterns extending along a first direction. A second hard mask is then formed on the patterned first hard mask. A patterned photoresist layer is formed on the second hard mask. The patterned photoresist layer includes second trench patterns extending along a second direction. The second trench patterns intersect first trench patterns. Using the patterned photoresist layer as an etch mask, a first etch process is performed to transfer the second trench patterns into the patterned first hard mask and the second hard mask. Subsequently, using the patterned first hard mask as an etch mask, a second etch process is performed to transfer the first trench patterns and the second trench patterns into the substrate.

9 Claims, 8 Drawing Sheets

III - III'

METHOD OF MANUFACTURING INDEPENDENT DEPTH-CONTROLLED SHALLOW TRENCH ISOLATION

CROSS REFERENCE TO RELATED APPLICATIONS

This application is a continuation of U.S. application Ser. No. 13/615,526 filed Sep. 13, 2012, which is included in its entirety herein by reference.

BACKGROUND OF THE INVENTION

1. Field of the Invention

The present invention relates to a semiconductor memory array structure, and more particularly to a memory array having independent depth-controlled shallow trench isolation, and methods of manufacturing the same.

2. Description of the Prior Art

As well known in the art, a shallow trench isolation structure comprises a dielectric material that laterally surrounds active areas (AA) of a semiconductor substrate comprising a semiconductor material, which is typically silicon. Typically, the shallow trench isolation structure is formed by first patterning a shallow trench that laterally surrounds the active area, followed by deposition of a dielectric material into the shallow trench and a subsequent planarization of the deposited dielectric material. The dielectric material is typically removed from above the active areas during the planarization step, and the remaining portions of the dielectric material within the shallow trench constitute the shallow trench isolation structure.

Conventionally, the aforesaid shallow trench that laterally surrounds the active area is formed by using a single lithographic process and a single dry etching process. That is, only one photomask (i.e., AA photomask) that defines the AA pattern thereon is used during the lithographic process, and the shallow trench has substantially the same depth. However, due to the line shortening effect and/or other optical interference effects, the AA pattern transferred to the photoresist or the underlying substrate has an oval-like shape that has a smaller surface area than the original pattern that defined on the AA photomask. This adversely affects the process window and the electric performance of the semiconductor device fabricated in the AA regions.

SUMMARY OF THE INVENTION

In one aspect, the present invention provides a memory array including a plurality of rhomboid-shaped active area (AA) regions in a substrate, each of the rhomboid-shaped AA regions having a pair of longer sides and a pair of shorter sides; a first shallow trench isolation (STI) structure extending along a first direction on the longer sides of the rhomboid-shaped AA region, wherein the first STI structure has a depth d1; and a second STI structure extending along the second direction on the shorter sides of the rhomboid-shaped AA region, wherein the second STI structure has two depths: d2 and d3, wherein d1 and d2 are shallower than d3.

In another aspect, the present invention provides a method of manufacturing a semiconductor structure. A patterned first hard mask is formed on a substrate. The patterned first hard mask includes a plurality of first trench patterns extending along a first direction. A second hard mask is then formed on the substrate and the patterned first hard mask. A patterned photoresist layer is formed on the second hard mask. The patterned photoresist layer includes a plurality of second trench patterns extending along a second direction. The plurality of second trench patterns partially overlap the plurality of first trench patterns. Using the patterned photoresist layer as an etch mask, a first etch process is performed to transfer the plurality of second trench patterns into the patterned first hard mask and the second hard mask. Subsequently, using the patterned first hard mask as an etch mask, a second etch process is performed to transfer the first trench patterns and the second trench patterns into the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1A:
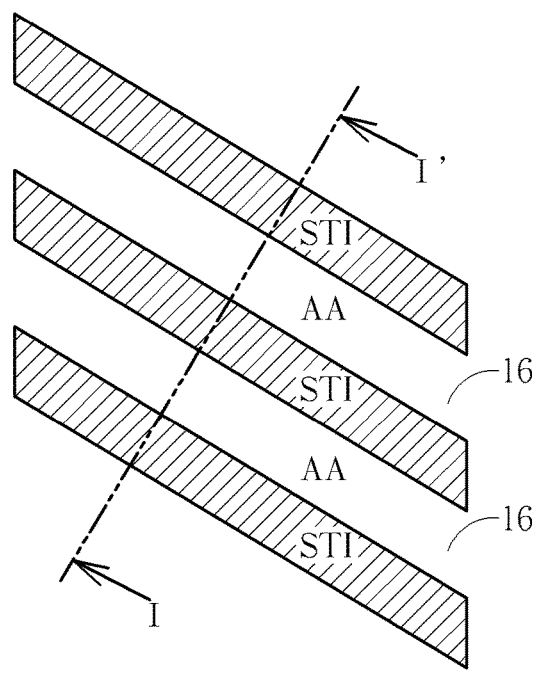
FIG. 1A is a schematic top view of a portion of a memory array after a patterned first hard mask defining a plurality of active area (AA) lines are formed on a substrate according to one embodiment of this invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Figure 1B:
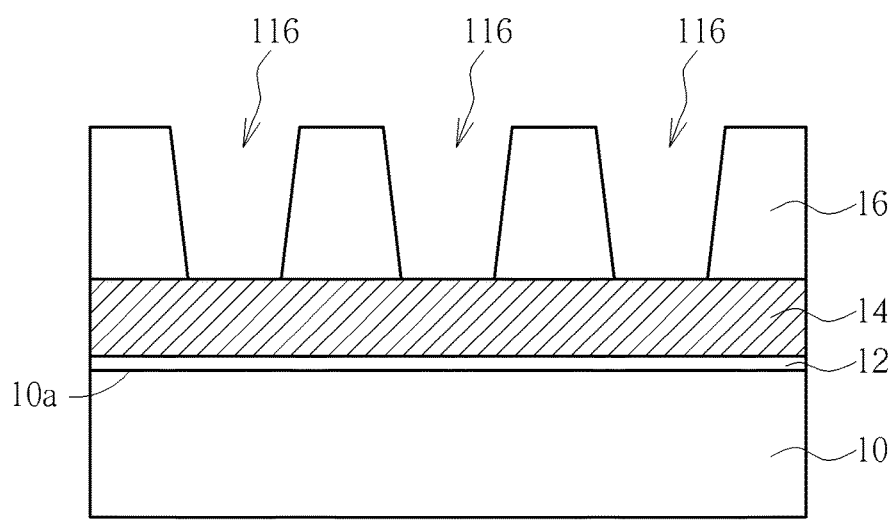
FIG. 1B and FIG. 2 are cross-sectional views taken along line I-I' in FIG. 1A.
Figure 2:
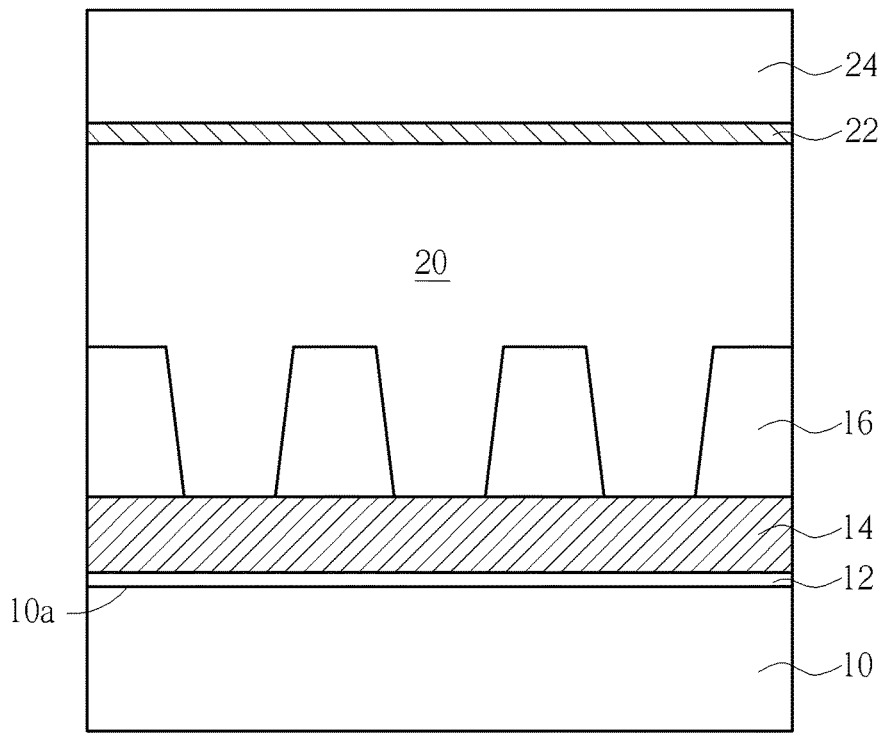

Please refer to FIG. 1A, FIG. 1B and FIG. 2. FIG. 1A is a schematic top view of a portion of a memory array after a patterned first hard mask defining a plurality of active area (AA) lines are formed on a substrate according to one embodiment of this invention. FIG. 1B and FIG. 2 are cross-sectional views taken along line I-I' in FIG. 1A. As shown in FIG. 1A and FIG. 1B, first, a substrate 10 such as a silicon substrate is provided. A silicon oxide pad layer 12 and a silicon nitride pad layer 14 are deposited on a main surface 10a of the substrate 10. A patterned first hard mask 16 such as silicon oxide is formed on the silicon nitride pad layer 14 by using a first lithographic process. The patterned first hard mask 16 defines a plurality of parallel AA lines extending along a first direction. The patterned first hard mask 16 includes a plurality of line-shaped trench patterns 116 that defines a first shallow trench isolation (STI). According to the embodiment, the thickness of the patterned first hard mask 16 may range between 800-1200 angstroms. As can be seen in FIG. 1B, preferably, each of the trench patterns 116 has a tapered sidewall.

Subsequently, as shown in FIG. 2, a second hard mask 20 such as a carbon-containing material and an anti-reflection coating (ARC) layer 22 such as silicon oxynitride are depositing on the substrate 10 in a blanket manner. The second hard mask 20 fills the trenches 116 and covers the patterned first hard mask 16. A photoresist layer 24 is then coated on the ARC layer 22. According to the embodiment, the thickness of the second hard mask 20 may range between 1000-4000 angstroms.

Figure 3A:
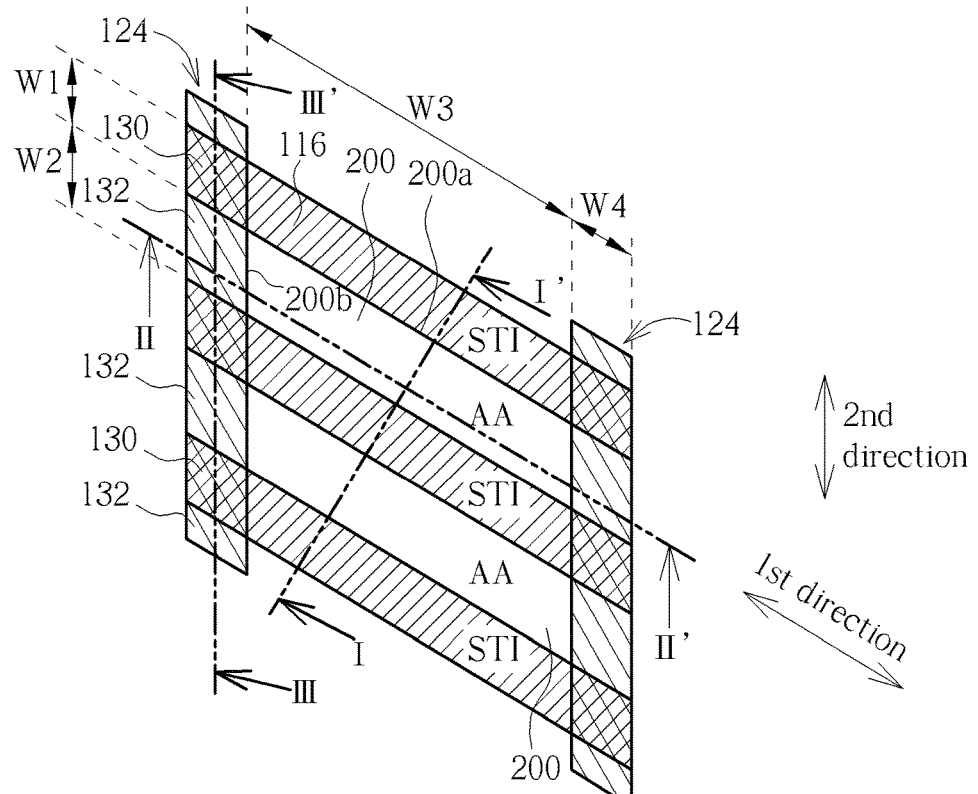
FIG. 3A is a schematic top view showing the memory array after the second STI pattern extending along the second direction is defined in the photoresist layer.
Figure 3B:
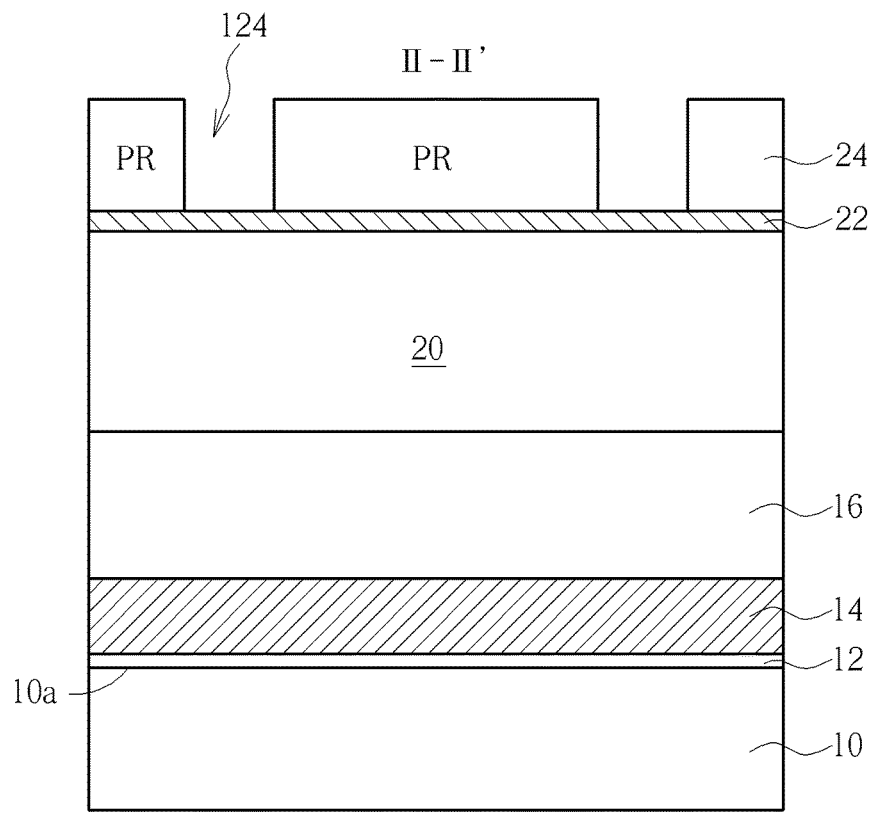
FIG. 3B and FIG. 3C are cross-sectional views taken along line II-II' and III-III' in FIG. 3A respectively.
Figure 3C:
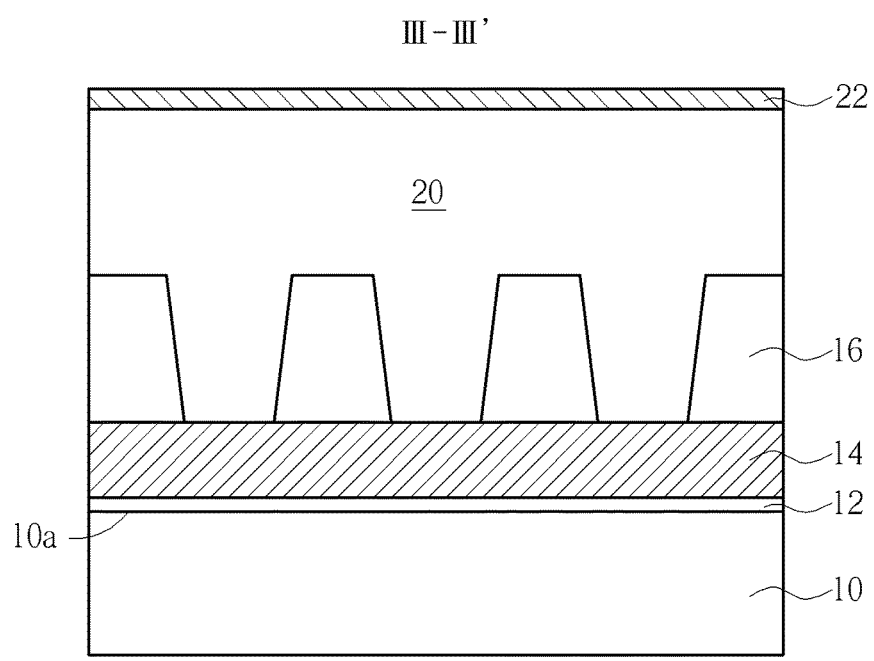

Please refer to FIG. 3A-3C. FIG. 3A is a schematic top view showing the memory array after the second STI pattern extending along the second direction is defined in the photoresist layer. FIG. 3B and FIG. 3C are cross-sectional views taken along line II-II' and III-III' in FIG. 3A respectively. As shown in FIG. 3A-3C, a second lithographic process is carried out to form a plurality of parallel trench patterns 124 extending along a second direction in the photoresist layer 24. As can be best seen in FIG. 3A, the parallel trench patterns 124 intersect the underlying trench patterns 116 at the overlapping regions 130 from a top view, thereby defining a plurality of rhomboid-shaped AA patterns 200. Each rhomboid-shaped AA pattern 200 includes two opposite longer sides 200a and two opposite shorter sides 200b. Along the second direction, a plurality of sub-regions 132 are provided between the overlapping regions 130 on either shorter side 200b of the rhomboid-shaped AA pattern 200. According to the embodiment, the first direction is not perpendicular to the second direction, that is, an acute angle may exist between the first and second directions. Along the second direction, a second STI intersecting the first STI will be formed into the substrate 10 in the subsequent process steps. In FIG. 3A, the widths of regions 130, 132, 116 and 124 are indicated respectively by w1, w2, w3 and w4, and the first and second directions are also indicated.

Figure 4A:
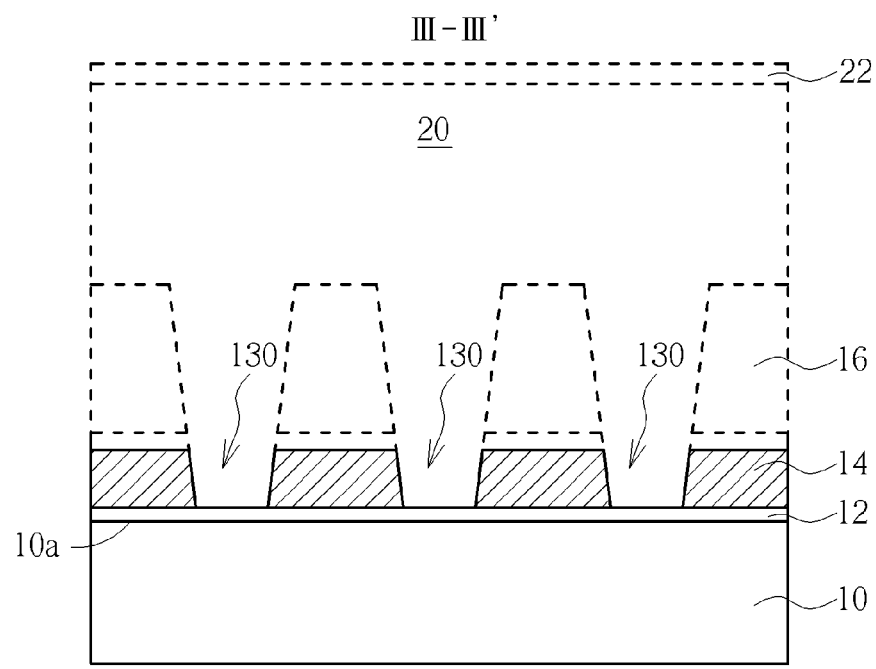
FIG. 4A and FIG. 4B are cross-sectional views taken along line II-II' and III-III' in FIG. 3A respectively, after the anisotropic dry etching process is performed.
Figure 4B:
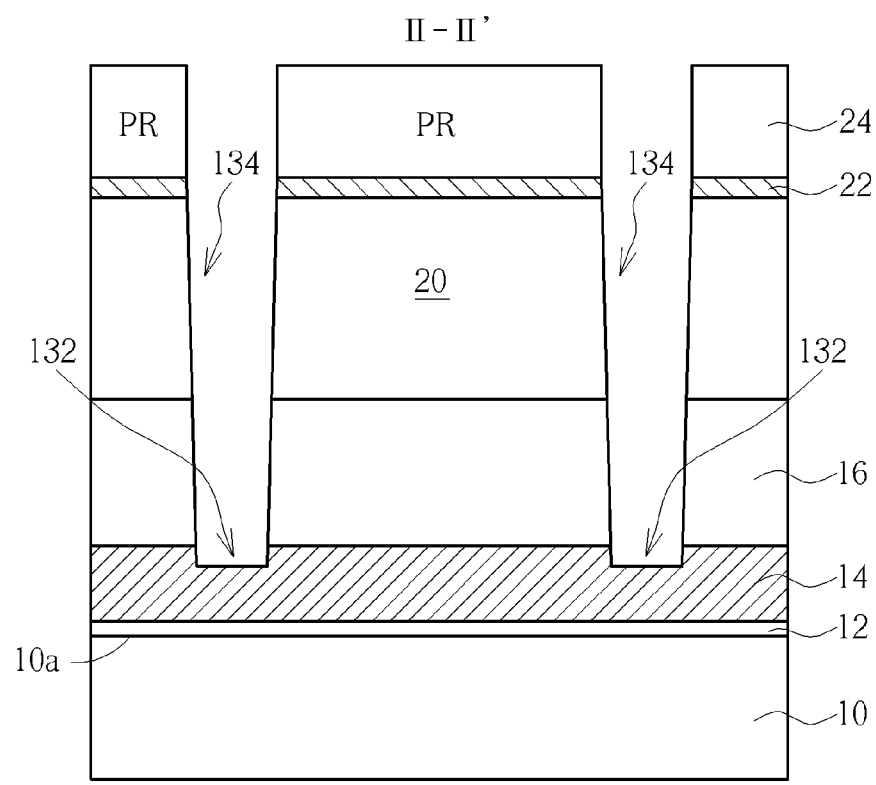

As shown in FIG. 4A and FIG. 4B, using the patterned photoresist layer 24 as a dry etching hard mask, an anisotropic dry etching process is then performed to etch the ARC layer 22, the second hard mask 20, the first hard mask 16, and a portion of the silicon nitride pad layer 14 through the trench patterns 124, thereby forming trench patterns 134 in the second hard mask 20 and the first hard mask 16. According to the embodiment, the amount of the silicon nitride pad layer 14 removed from the overlapping regions 130 is more than that removed from the sub-regions 132. For example, the silicon nitride pad layer 14 may be completely removed from the trench patterns 124 to expose the silicon oxide pad layer 12, while in the overlapping regions 130 merely a small portion of the silicon nitride pad layer 14 is removed. Preferably, each of the trench patterns 134 has a tapered sidewall. Alternatively, according to another embodiment, the silicon nitride pad layer 14 may be completely removed from the trench patterns 124 to expose the silicon oxide pad layer 12 at the area 130. The cross section of this area 130 is shown in FIG. 4A. For the nitride loss at area 132, it has merely a small amount of loss shown in FIG. 4B. Preferably, each of the trench patterns 134 has a tapered sidewall.

Figure 5A:
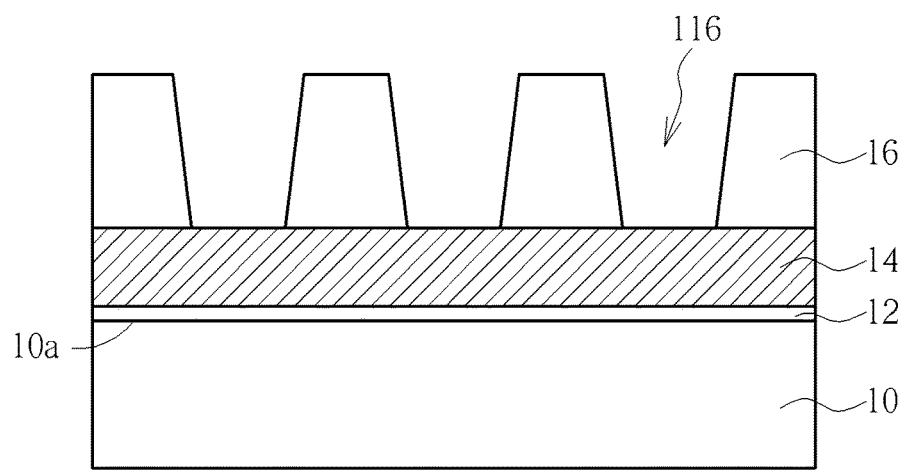
FIG. 5A, FIG. 5B and FIG. 5C are cross-sectional views taken along lines I-I', II-II' and III-III' in FIG. 3A respectively, after the remaining photoresist layer, the ARC layer, and the second hard mask are removed.
Figure 5B:
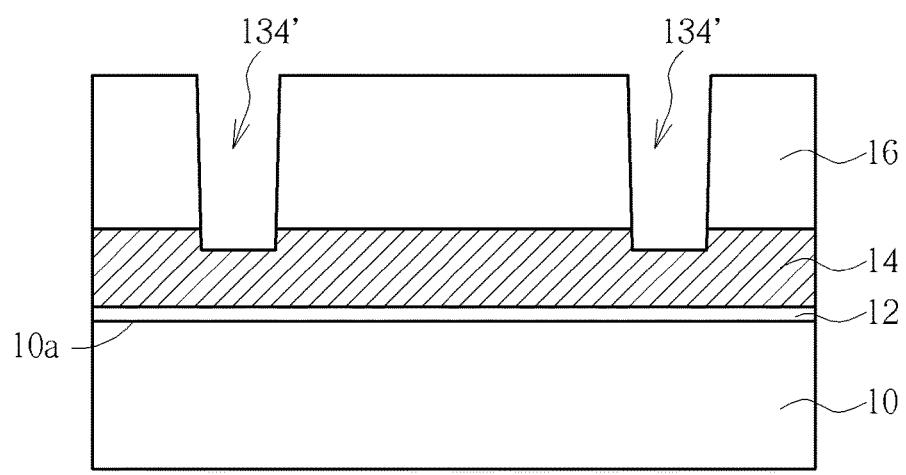
Figure 5C:
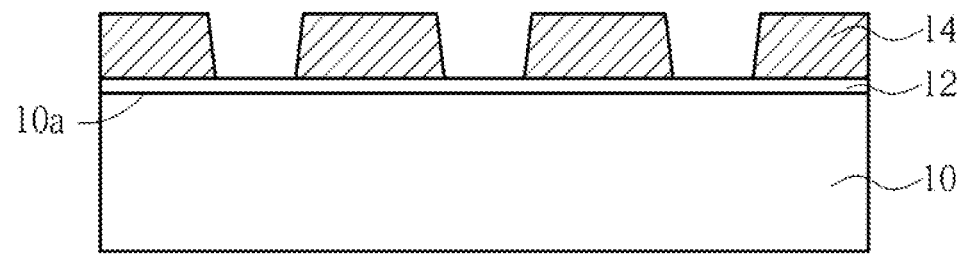

FIG. 5A, FIG. 5B and FIG. 5C are cross-sectional views taken along lines I-I', II-II' and III-III' in FIG. 3A respectively. As shown in FIG. 5A, FIG. 5B and FIG. 5C, after the anisotropic dry etching process is completed, the remaining photoresist layer 24, the ARC layer 22, and the second hard mask 20 are removed to reveal the patterned first hard mask 16. The patterned first hard mask 16 in FIG. 5A decides the width of each of the AA regions to be formed in the substrate 10. As can be best seen in FIG. 5B, the patterned first hard mask 16 are cut through on both shorter side 200b of the rhomboid-shaped AA pattern 200. Preferably, each of the trench patterns 134' on both shorter side 200b of the rhomboid-shaped AA pattern 200 has a tapered sidewall. The trench patterns 134' decide the length of the each of the AA regions to be formed in the substrate 10.

Figure 6A:
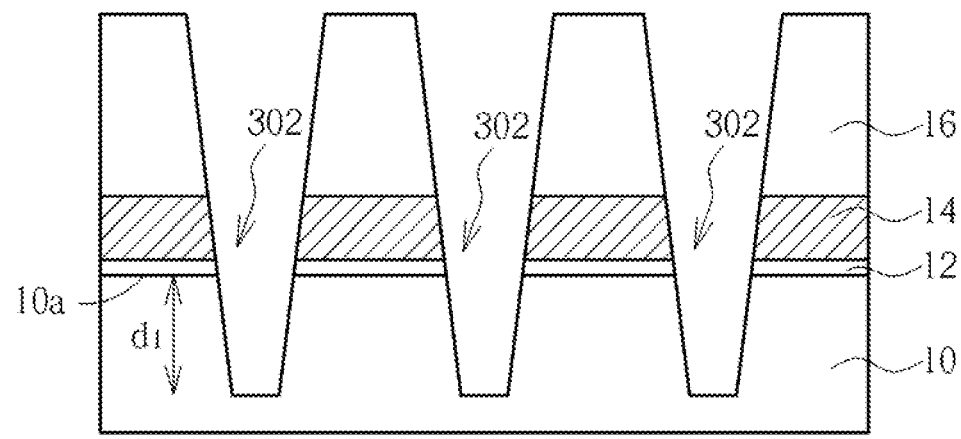
FIG. 6A, FIG. 6B and FIG. 6C are cross-sectional views taken along lines I-I', II-II' and III-III' in FIG. 3A respectively, after STI etching.
Figure 6B:
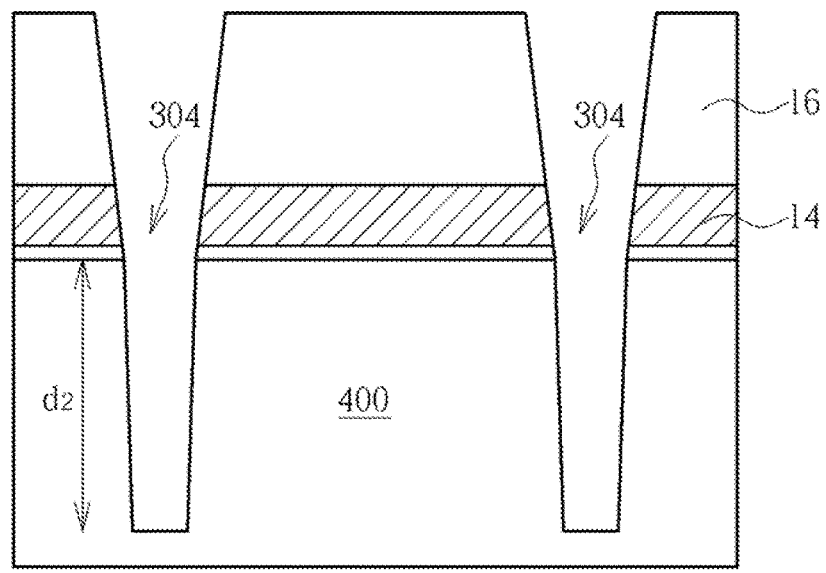
Figure 6C:
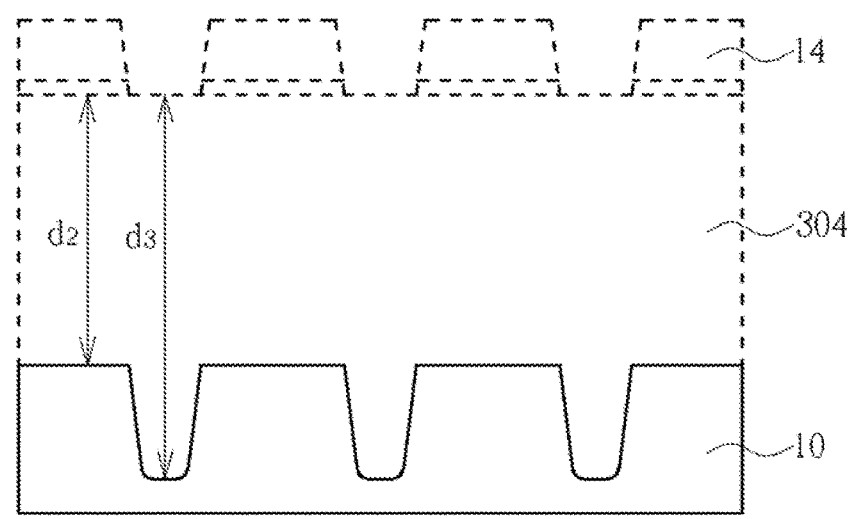

FIG. 6A, FIG. 6B and FIG. 6C are cross-sectional views taken along lines I-I', II-II' and III-III' in FIG. 3A respectively. As shown in FIG. 6A, FIG. 6B and FIG. 6C, using the patterned first hard mask 16 as a dry etching hard mask, an anisotropic dry etching process is performed to etch the silicon nitride pad layer 14, the silicon oxide pad layer 12 and the substrate 10 through the trench patterns 116 and 134', thereby forming first STI structure 302 extending in the first direction and second STI structure 304 extending along the second direction, and rhomboid-shaped AA regions 400. According to the embodiment, the first STI structure 302 has a depth d1 (FIG. 6A), the second STI structure 304 has two depths: d2 and d3 (FIG. 6B), wherein d1 and d2 are shallower than d3. According to the embodiment, the depth d1 and d2 may range between 2300~2600 angstroms, while the depth d3 may range between 2600-2800 angstroms. Subsequently, a trench fill material (not shown) may be filled into the first and second STI structures 302 and 304 to form electric isolation. The width w1 of the overlapping region 130 and width w4 of the trench pattern 124, as shown in FIG. 3A, substantially determine the depth d1 and d2 shown in FIG. 6A and 6B. The depth d1 is not necessarily shallower than d2.

Figure 7:
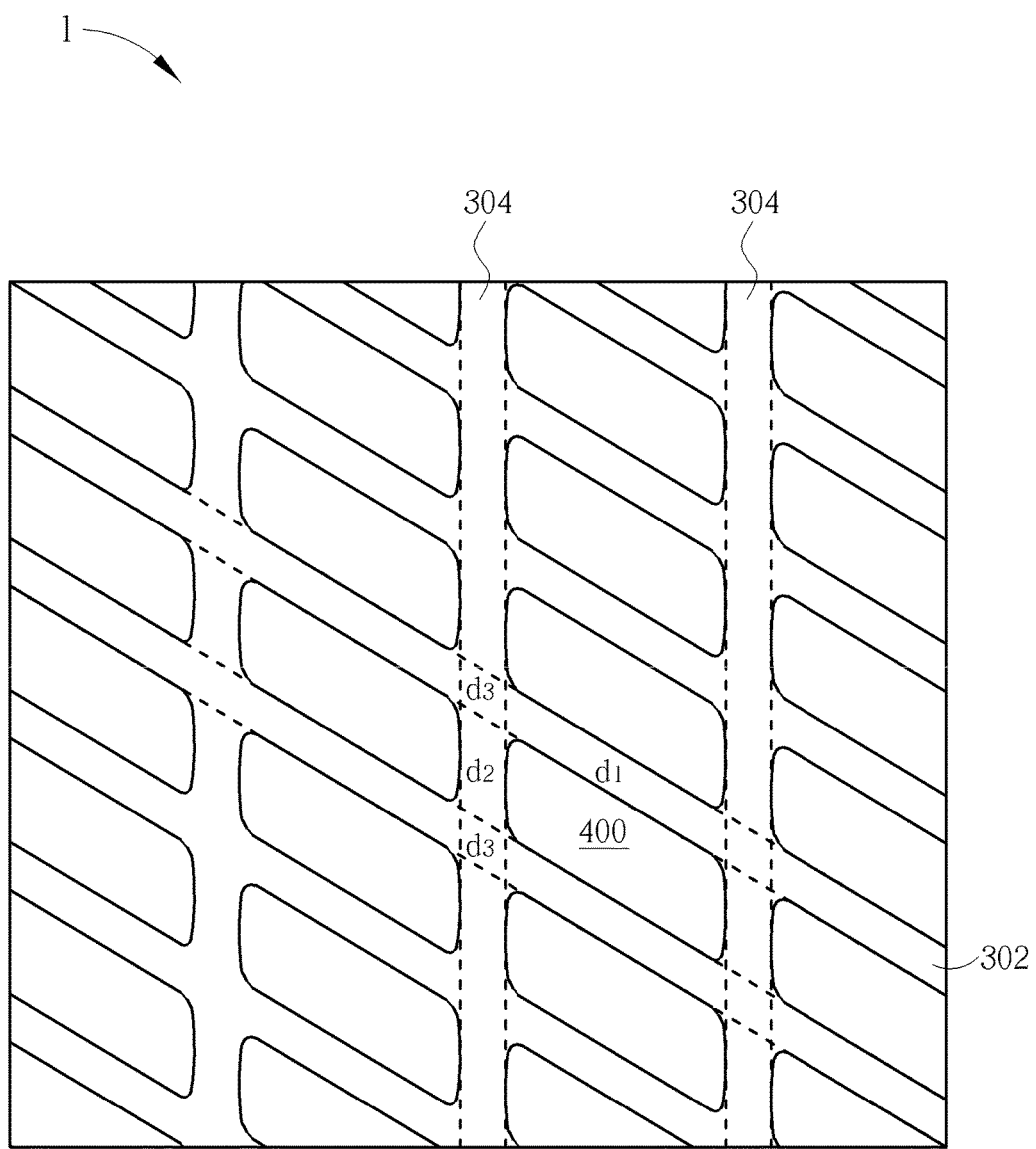
FIG. 7 shows a top view of the memory array including the rhomboid-shaped AA regions and the first and second STI structures with independent depth control.

FIG. 7 shows a top view of the memory array 1 including a plurality of rhomboid-shaped AA regions 400 and the first and second STI structures 302 and 304 surrounding each of the rhomboid-shaped AA regions 400. As shown in FIG. 7, since the second STI structure 304 provides a deep trench depth along the second direction (i.e., word line direction), the electric isolation between adjacent word lines (WL) can be significantly improved. The WL-WL coupling effect can be reduced.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of manufacturing a semiconductor structure, comprising:

providing a substrate having thereon a pad layer;

forming a patterned first hard mask on the pad layer, wherein said patterned first hard mask includes a plurality of first trench patterns extending along a first direction, wherein portions of the pad layer are exposed by the plurality of first trench patterns;

forming a second hard mask on said substrate and said patterned first hard mask;

forming a patterned photoresist layer on said second hard mask, wherein said patterned photoresist layer includes a plurality of second trench patterns extending along a second direction, and said plurality of second trench patterns partially overlap said plurality of first trench patterns;

using said patterned photoresist layer as an etch mask to perform a first etch process, thereby transferring said plurality of second trench patterns into said patterned first hard mask and said second hard mask, wherein said portions of the pad layer exposed by the plurality of first trench patterns are completely removed; and using said patterned first hard mask as an etch mask to perform a second etch process, thereby transferring said first trench patterns and said second trench patterns into said substrate, so as to form a plurality of first trench isolation structures extending along the first direction having a first depth and a plurality of second trench isolation structures extending along the second direction having a second depth and a third depth in the substrate, wherein the third depth is deeper than the second depth, wherein each said first trench isolation structure intersects each said second trench isolation structure within the substrate to thereby form an rhomboid-shaped overlapping region having the third depth.

2. The method of manufacturing a semiconductor structure according to claim 1 wherein the patterned first hard mask comprises silicon oxide.

3. The method of manufacturing a semiconductor structure according to claim 2 wherein the patterned first hard mask is formed on a silicon nitride pad layer.

4. The method of manufacturing a semiconductor structure according to claim 1 wherein the second hard mask is in direct contact with said patterned first hard mask.

5. The method of manufacturing a semiconductor structure according to claim 1 wherein the second hard mask comprises a carbon-containing material.

6. The method of manufacturing a semiconductor structure according to claim 1 wherein the second hard mask has a thickness ranging between 1000 angstroms and 4000 angstroms.

7. The method of manufacturing a semiconductor structure according to claim 1 wherein the second trench patterns intersect said plurality of first trench patterns from a top view.

8. The method of manufacturing a semiconductor structure according to claim 1 wherein the first direction is not perpendicular to said second direction.

9. The method of manufacturing a semiconductor structure according to claim 1 wherein the pad layer is a silicon nitride pad layer.

* * * * *